(12) United States Patent
Kodama

(10) Patent No.: US 9,147,634 B2
(45) Date of Patent: Sep. 29, 2015

(54) SEMICONDUCTOR DEVICE, AND ON-BOARD POWER CONVERSION DEVICE

(75) Inventor: Katsuhisa Kodama, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/352,015

(22) PCT Filed: Nov. 30, 2011

(86) PCT No.: PCT/JP2011/077620
§ 371 (c)(1),
(2), (4) Date: May 22, 2014

(87) PCT Pub. No.: WO2013/080317
PCT Pub. Date: Jun. 6, 2013

(65) Prior Publication Data

US 2014/0252587 A1    Sep. 11, 2014

(51) Int. Cl.
| | |
|---|---|
| *H01L 23/10* | (2006.01) |
| *H01L 23/34* | (2006.01) |
| *H01L 23/40* | (2006.01) |
| *H05K 7/20* | (2006.01) |

(Continued)

(52) U.S. Cl.
CPC ........ *H01L 23/4006* (2013.01); *H01L 23/4338* (2013.01); *H05K 7/2049* (2013.01); *H05K 7/20927* (2013.01); *H01L 23/49562* (2013.01); *H01L 2023/4018* (2013.01); *H01L 2023/4087* (2013.01); *H01L 2924/0002* (2013.01)

(58) Field of Classification Search
USPC .................. 257/706, 718, 713, 714, E23.084
See application file for complete search history.

(56) References Cited

U.S. PATENT DOCUMENTS

| | | | |
|---|---|---|---|
| 5,396,404 | A | 3/1995 | Murphy et al. |
| 5,504,653 | A | 4/1996 | Murphy et al. |

(Continued)

FOREIGN PATENT DOCUMENTS

| | | |
|---|---|---|
| DE | 1539656 | 11/1969 |
| EP | 0092720 A1 | 11/1983 |

(Continued)

OTHER PUBLICATIONS

Communication dated Jul. 15, 2014 from the Japanese Patent Office in counterpart Japanese Patent Application No. 2013546893.

(Continued)

*Primary Examiner* — Nitin Parekh
(74) *Attorney, Agent, or Firm* — Sughrue Mion, PLLC; Richard C. Turner

(57) ABSTRACT

Provided is a semiconductor device capable of improving heat-radiating performance of a heating element. The semiconductor device of the present invention includes: a heating element (1); a heat-radiating member (2) including an element contact portion (2*a*) which is held surface contact with a mounting surface (1*e*); a first pressing member (3) and a second pressing member (4) held in contact with the heating element (1); and a fixation screw (6) for fixing the first pressing member (3) to the heat-radiating member (2) through a through hole (3*c*) formed through the first pressing member (3). The first pressing member (3) and the second pressing member (4) each include an inclined surface formed so that a component force of an axial force of a tightening force of the fixation screw (6) is generated in a vertical direction with respect to the mounting surface (1*e*).

12 Claims, 9 Drawing Sheets

(51) Int. Cl.
*H01L 23/433* (2006.01)
*H01L 23/495* (2006.01)

(56) References Cited

U.S. PATENT DOCUMENTS

| | | | |
|---|---|---|---|
| 7,633,758 B2 * | 12/2009 | Oohama | 361/717 |
| 2002/0034087 A1 * | 3/2002 | Suzuki et al. | 363/144 |
| 2003/0075784 A1 | 4/2003 | Nakase et al. | |
| 2005/0128706 A1 * | 6/2005 | Maly et al. | 361/699 |
| 2005/0135065 A1 | 6/2005 | Nakatsu et al. | |
| 2007/0096278 A1 * | 5/2007 | Nakatsu et al. | 257/678 |
| 2007/0159864 A1 * | 7/2007 | Yoshizaki et al. | 363/89 |
| 2008/0164607 A1 * | 7/2008 | Harada et al. | 257/734 |

FOREIGN PATENT DOCUMENTS

| | | | |
|---|---|---|---|
| EP | 1067831 | A1 | 1/2001 |
| EP | 1708260 | A2 | 10/2006 |
| JP | 2138762 | A | 5/1990 |
| JP | 7176658 | A | 7/1995 |
| JP | 9-134985 | A | 5/1997 |
| JP | 11308793 | A | 11/1999 |
| JP | 2000-91485 | A | 3/2000 |
| JP | 2001-332670 | A | 11/2001 |
| JP | 2002-198477 | A | 7/2002 |
| JP | 2003234440 | A | 8/2003 |
| JP | 2005-183644 | A | 7/2005 |
| JP | 2007-53295 | A | 3/2007 |
| JP | 2008-147306 | A | 6/2008 |
| JP | 2011-82344 | A | 4/2011 |

OTHER PUBLICATIONS

Communication dated Jul. 9, 2015, issued by the European Patent Office in counterpart Application No. 11876780.5.

* cited by examiner

DETAILS OF Z PORTION

SEMICONDUCTOR DEVICE, AND ON-BOARD POWER CONVERSION DEVICE

CROSS REFERENCE TO RELATED APPLICATIONS

This application is a National Stage of International Application No. PCT/JP2011/077620 filed Nov. 30, 2011, the contents of all of which are incorporated herein by reference in their entirety.

TECHNICAL FIELD

The present invention relates to a semiconductor device, and an in-vehicle power converter incorporated with the semiconductor device, which is to be mounted on a plug-in hybrid vehicle, an electric automobile, or the like, such as a charger for converting an input AC power supply into a direct current to charge a high-voltage battery and a DC-DC converter for converting a voltage of the high-voltage battery into a 12V-system voltage to charge an auxiliary battery.

BACKGROUND ART

Conventionally, a heating element, in particular, a power element for performing switching control of a large current is provided on a heat-radiating member so as to be fixed thereon because of a large heat generation amount. In this manner, the heat from the heating element is transferred to a cooling medium through the heat-radiating member to cool the heating element.

In the case of an in-vehicle power converter such as the charger and the DC-DC converter described above, high cooling performance for the device is required in view of an environment in which the device is mounted in a vehicle and an operation environment.

A structure for mounting the heating element to the heat-radiating member is described in, for example, Patent Literatures 1 to 4.

Patent Literatures 1 to 3 describe a structure for pressing an electric device against a top of the heat-radiating member by an elastic force of a pressing member.

Moreover, Patent Literature 4 describes a structure of a rotation stop plate for the heating element when the heating element is to be fastened to the heat-radiating member.

CITATION LIST

Patent Literature

[PTL 1] JP 09-134985 A
[PTL 2] JP 2001-332670 A
[PTL 3] JP 2002-198477 A
[PTL 4] JP 2011-82344 A

SUMMARY OF INVENTION

Technical Problems

A plug-in hybrid vehicle includes an engine mounted therein. Therefore, it is difficult to lay out the in-vehicle power converter in the vehicle. An electric automobile is a small vehicle. Therefore, a request for the size reduction of the in-vehicle power converter is remarkably strong. For the size reduction of the in-vehicle power converter, the cooling performance of the in-vehicle power converter is required to be further improved because of an increase in heat capacity with the reduction in size.

In the related art in which the heating element is directly mounted to the heat-radiating member by a fastening member, however, a difference is generated in a pressing force of the fastening member due to a variation in size between the heating elements. As a result, stable heat-radiation performance (low thermal resistance) cannot be obtained.

In the structures as described in Patent Literatures 1 to 3 cited above, in which the heating element is pressed against the top of the heat-radiating member by the elastic force of the pressing member, a thermal contact resistance between the heating element and the heat-radiating member becomes higher because of an originally small pressing force.

Moreover, stable heat-radiation performance (low thermal resistance) cannot be obtained due to degradation of the pressing member caused by heat or vibration.

Further, when the heating element is provided on a bottom surface of the heat-generating member as in the case of the structure described in Patent Literature 4, there is a problem in that a component mounting area is increased.

The present invention has been made to solve the problems described above, and has an object to provide a semiconductor device capable of improving heat-radiating performance of a heating element and reducing a mounting area of a mounting board.

Moreover, the present invention has another object to provide an in-vehicle power converter capable of suppressing interference of heat with other components and capable of reducing a size of the entire in-vehicle power converter.

Solution to Problems

According to one embodiment of the present invention, there is provided a semiconductor device including: a mounting board; a heating element including terminals extending in a vertical direction with respect to the mounting board, the heating element being connected to the mounting board through the terminals; a heat-radiating member including an element contact portion which is held in direct or indirect surface contact with a mounting surface of the heating element; pressing means held in contact with the heating element, for pressing the heating element against the heat-radiating member; and fastening means for fixing the pressing means to the heat-radiating member through a through hole formed through the pressing means in parallel to the mounting surface, in which the pressing means includes an inclined surface formed so that a component force of an axial force of a tightening force of the fastening means is generated in a vertical direction with respect to the mounting surface.

Further, according to one embodiment of the present invention, there is provided an in-vehicle power converter including: a semiconductor device; and a cooler for cooling a large-current component, the cooler including a cooling medium hermetically sealed therein, in which the semiconductor device is embedded in the cooler including the element contact portion of the heat-radiating member.

Advantageous Effects of Invention

According to the semiconductor device of the present invention, the heating element is connected to the mounting board through the terminal extending in the vertical direction with respect to the mounting board. Therefore, the mounting area of the mounting board can be reduced.

Moreover, the pressing member, which is held in contact with the heating element, for pressing the heating element against the heat-radiating member, is provided with the inclined surface formed so that the component force of the axial force of the tightening force of the fastening means is generated in the vertical direction with respect to the mounting surface. Therefore, the pressing force generated by the pressing means on the heating element is increased by the tightening force of the fastening means. As a result, a thermal contact resistance between the heating element and the heat-radiating member is reduced to improve heat-radiation performance of the heating element.

According to the in-vehicle power converter of the present invention, the semiconductor device is embedded in the cooler including the element contact portion of the heat-radiating member. Therefore, interference of heat with the other components can be suppressed to enable the reduction of the entire in-vehicle power converter in size.

DESCRIPTION OF EMBODIMENTS

Figure 1:
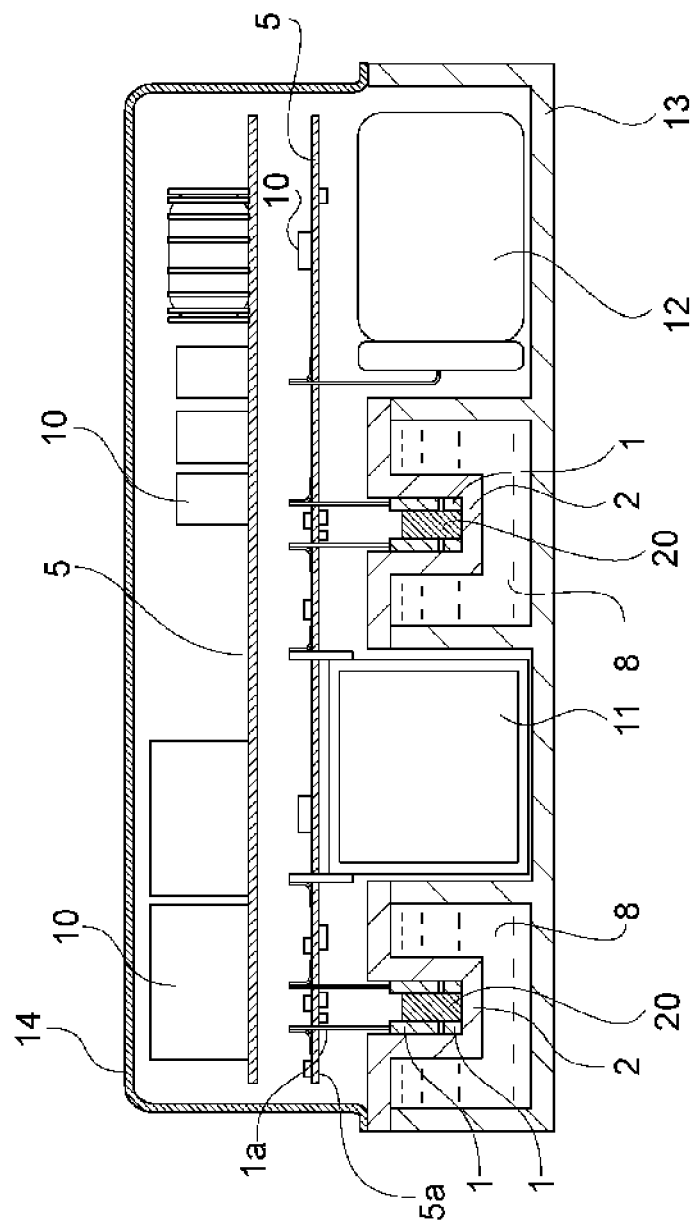
FIG. 1 is a schematic sectional view illustrating an in-vehicle power converter of the present invention.

Referring to the accompanying drawings, embodiments of the present invention are described below. In the drawings, the same or corresponding components and parts are denoted by the same reference symbols.

First Embodiment

Figure 2:
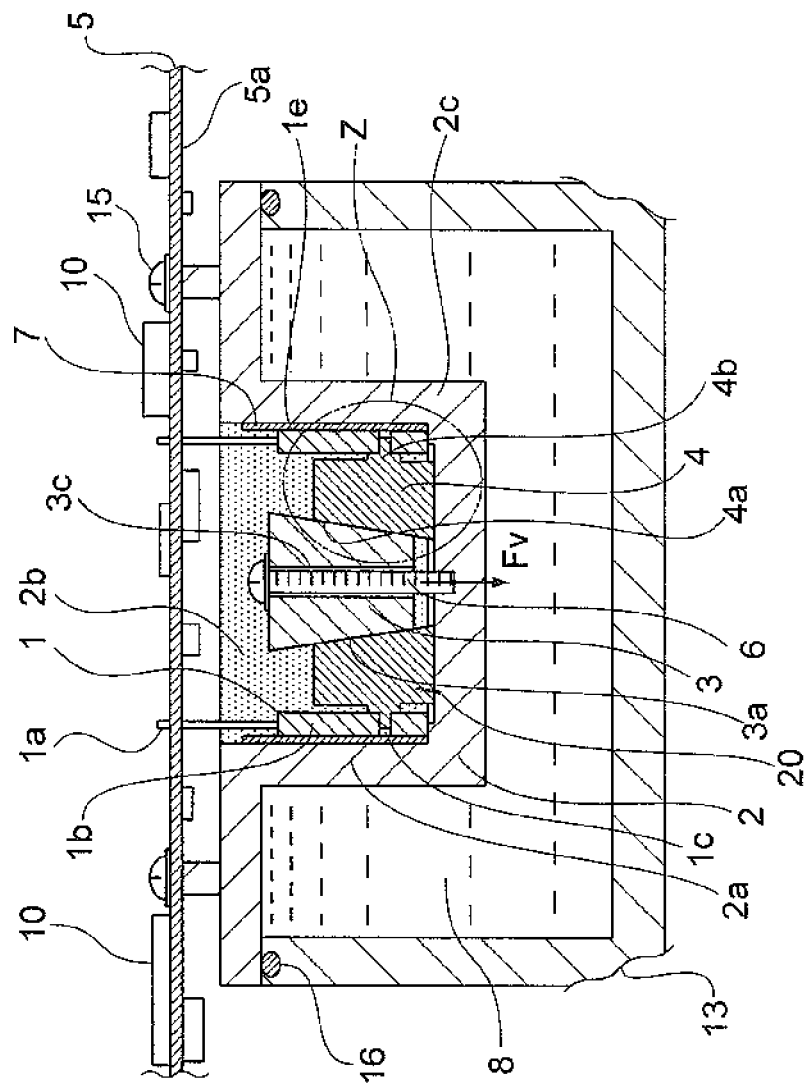
FIG. 2 is a sectional view illustrating a semiconductor device illustrated in FIG. 1.

FIG. 1 is a schematic sectional view illustrating an in-vehicle power converter of the present invention, and FIG. 2 is a sectional view illustrating a semiconductor device illustrated in FIG. 1.

In the in-vehicle power converter, coolers 8 including heat-radiating members 2 and a case 13 are covered with a cover 14. Inside the case 13, a coil 11 and a capacitor 12, which are high-current components, are provided. Moreover, a semiconductor device according to a first embodiment of the present invention is embedded in a concave portion 2c of each of the heat-radiating members 2. Above the coolers 8, a plurality of electronic components 10 mounted on a mounting board 5 are provided.

Each of the semiconductor devices includes heating elements 1 which are connected to the mounting board 5 through terminals 1a extending in a vertical direction with respect to the mounting board 5, the heat-radiating member 2 including element contact portions 2a, each being held in surface contact with a mounting surface 1e of a corresponding one of the heating elements 1 through a heat-radiating sheet 7, pressing means 20 which is held in contact with the heating elements 1 to press the heating elements 1 against the heat-radiating member 2, and a fixation screw 6 which is fastening means for fixing the pressing means 20 to the heat-radiating member 2 through a through hole 3c formed through the pressing means 20 in parallel to the mounting surface 1a.

Inclined surfaces are formed on the pressing means 20 so that a component force of an axial force of a tightening force of the fixation screw 6 is generated thereon in a vertical direction with respect to the mounting surface 1e of each of the heating elements 1.

The heating element 1 covers a bare chip with a resin-molded package 1b. A mounting hole 1c is formed by passing through the package 1b.

The heat-radiating members 2, each being made of an aluminum material having a high thermal conductivity or the like, are fixed onto the mounting board 5 with a plurality of fixation screws 15 (for example, at four corners of each of the heat-radiating members 2).

The concave portion 2c is formed in a middle portion of each of the heat-radiating members 2. A pair of the heating elements 1 faces the element contact portions 2a which are side surfaces of the concave portion 2c through the heat-radiating sheets 7. Each of the heat-radiating sheets 7 is made of a silicon material or the like, and functions to transfer heat between the heating elements 1 and the heat-radiating member 2 and to insulate the elements and member from a current.

The pressing means 20 embedded in the concave portion 2c includes a first pressing member 3 and second pressing members 4, which are made of an aluminum material or the like. The through hole 3c is formed through the first pressing member 3. The first pressing member 3 is fixed to the heat-radiating member 2 by the fixation screw 6 passing through the through hole 3c. The first pressing member 3 has inclined surfaces 3a having both side surfaces approaching each other toward a bottom surface of the concave portion 2c.

The second pressing members are 4 provided on both sides of the first pressing member 3, and respectively include inclined surfaces 4a which are respectively held in surface contact with the inclined surfaces 3a.

Each of the second pressing members 4 includes a projection 4b formed on a surface on the side opposite to the inclined surface 4a. The projection 4b is fitted into the mounting hole 1c of each of the heating elements 1.

A space portion of the concave portion 2c is filled with grease 2b. The grease 2b may be omitted.

In the cooler 8, the heat-radiating member 2 hermetically seals a part of the interior of the case 13 through an O-ring 16. The hermetically-sealed case 13 is filled with, for example, water as a cooling medium. The water circulates through the heat-radiating medium 2 and externally provided cooling means (not shown), and is cooled by the cooling means.

The cooling medium may also be air.

In the semiconductor device having the configuration described above, the heating elements 1 are provided to extend in the vertical direction with respect to a board mounting surface 5a. Therefore, a component mounting area of the mounting board 5 can be reduced.

Figure 3:
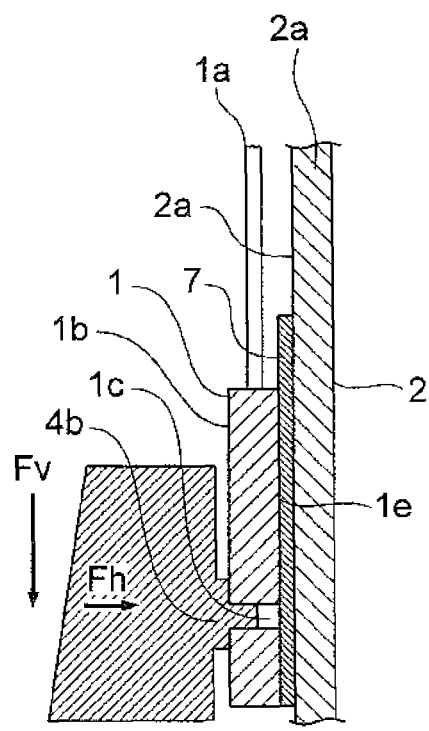
FIG. 3 is a drawing expanding Z part in FIG. 2.

Moreover, the through hole 3c formed through the first pressing member 3 is provided in parallel to the element contact portions 2a of the heat-radiating member 2. The first pressing member 3 and the second pressing members 4 are held in surface contact with each other through the inclined surfaces 3a and 4a. The inclined surfaces 3a and 4a are inclined so that a component force Fh of an axial force Fv of the fixation screw 6 is oriented in the vertical direction with respect to the element contact portion 2a, as illustrated in FIG. 3.

Therefore, the heating element 1 is strongly pressed against the element contact portion 2a with the component force Fh of the axial force of the fixation screw 6, which is generated by tightening the fixation screw 6. Thus, a thermal contact resistance between the heating element 1 and the heat-radiating member 2 is reduced to improve heat-radiation performance of the heating element 1.

As a result, interference of heat with the other components can be suppressed. Thus, the entire in-vehicle power converter can be reduced in size.

Moreover, for example, a diameter of the fixation screw 6 used to fix the heating elements 1 can be changed to be larger from an M3 screw to an M4 screw or the like. As a result, the same type of fastening screw as those used for the other components can be used. As a result, workability in assembly can be improved.

Figure 10:
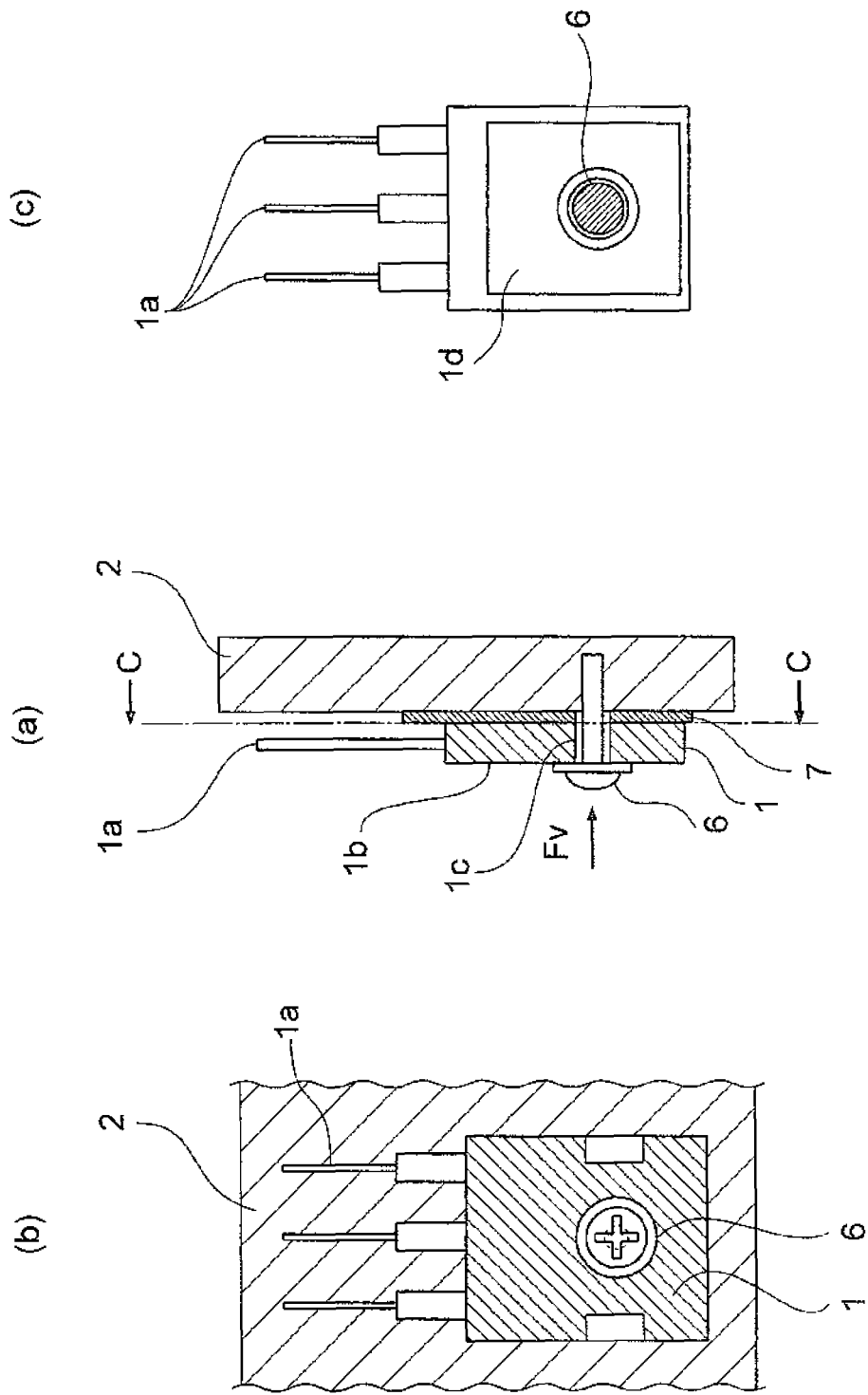
FIG. 10(a) is a sectional view illustrating a principal part of a conventional semiconductor device.
FIG. 10(b) is a plan view of FIG. 10(a) aid
FIG. 10(c) is a sectional view taken along the line c-c in FIG. 5.

Specifically, in the case of a semiconductor device illustrated in FIG. 10 illustrating a conventional mounting structure for an electronic component, when the heating element 1 is fixed to the heat-radiating member 2 by using the mounting hole 1c of the heating element 1 with the M3 screw, a pressing force is Fv=740 [N] (=rated axial force of the M3 screw).

On the other hand, when the heating element 1 is fixed to the heat-radiating member 2 by using the first pressing member 3 and the second pressing members 4, as in this embodiment, the inclined surfaces 3a of the first pressing member 3 and the inclined surfaces 4a of the second pressing members 4 are formed at 30° with respect to an axis line of the fixation screw 6, and fixation is performed with the M4 screw (axial force Fv=1290 [N]). Then, a pressing force equal to that in the fixed state using the M3 screw, which is illustrated in FIGS. 10, is obtained (Fh=Fv×tan 30°).

In the case of the example where the M4 screw is used, when a pressing area of the heating element 1 is $3 \times 10^{-4}$ [m$^2$], the pressing force is 2.5 [MPA]. The force has a value which is sufficient for the heat-radiating sheet 7 to demonstrate heat-transfer performance.

Moreover, in the semiconductor device according to this embodiment, the pressing force of the heating element 1 on the heat-radiating member 2 can be arbitrarily set by changing the inclined surfaces 3a of the first pressing member 3 and the inclined surfaces 4a of the second pressing members 4 with respect to the axis line of the fixation screw 6.

Thus, an angle can be adjusted to obtain an optimal pressing force in accordance with the strength of the heating element 1 to be pressed. Accordingly, the degree of freedom in design is improved.

Moreover, because of the structure in which the pressing is performed vertically to the element contact portions 2a, there is provided an advantage in that a rotational stress by the rotation of the fixation screw 6 is not generated in the heating elements 1, the heat-radiating sheets 7, and the terminals 1a.

Specifically, as can be seen from FIG. 10(c), the rotational stress is exerted on the heating element 1 and the terminals 1a with the rotation of the fixation screw 6 in the conventional semiconductor device. However, the rotational stress is not generated in the semiconductor device of this embodiment.

The projection 4b of the second pressing member 4 is fitted into the mounting hole 1c of the heating element 1 to press the heating element 1 against the corresponding one of the element contact portions 2a of the heat-radiating member 2 through the heat-radiating sheet 7.

Therefore, the second pressing members 4 retain and position the heating element 1. In addition, the mounting hole 1c is formed at a position of the heating element 1, at which a withstand load of the heating element 1 is high, and the projection 4b is formed in alignment with the mounting hole 1c. In this manner, the deformation and breakage of the package 1b of the heating element 1 under the load can be prevented.

In the case where the package 1b does not have the mounting hole 1c, the projection 4b only needs to be pressed against a portion of the package 1b, which has a high withstand load.

Further, the terminals 1a of the heating element 1 extend in the vertical direction with respect to the mounting board 5. Therefore, not only terminal bending work is not required, but also a distance between the fixation screw 6 and the heating element 1 according to the first embodiment is larger than that of the semiconductor device illustrated in FIG. 10, which illustrate the conventional mounting structure for the electronic component. Accordingly, the following advantage is provided.

Specifically, in the semiconductor device illustrated in FIG. 10, a plane of the heating element 1 is held in surface contact with the heat-radiating member 2. Although the heating element 1 presses the heat-radiating member 2 with the entire axial force of the fixation screw 6 passing through the mounting hole 1c of the heating element 1, the fixation screw 6 passes through a conductor portion 1d of the heating element 1. On the other hand, in this embodiment, the first pressing member 3 and the second pressing members 4 are present between the fixation screw 6 and the conductor portion 1d of the heating element 1.

Therefore, the risk of short-circuiting of the heating element 1 due to chips generated when the fixation screw 6 is screwed into the heat-radiating member 2 is lowered.

Moreover, the two heating elements 1 can be pressed against the heat-radiating member 2 by the single fixation screw 6 to be fixed. Therefore, the number of fixation screws 6 required to fix the heating elements 1 can be halved. At the same time, a direction in which the fixation screw 6 is tightened becomes equal to a direction in which the mounting board 5 and the other components are tightened. Therefore, the workability in assembly is improved.

Second Embodiment

Figure 4:
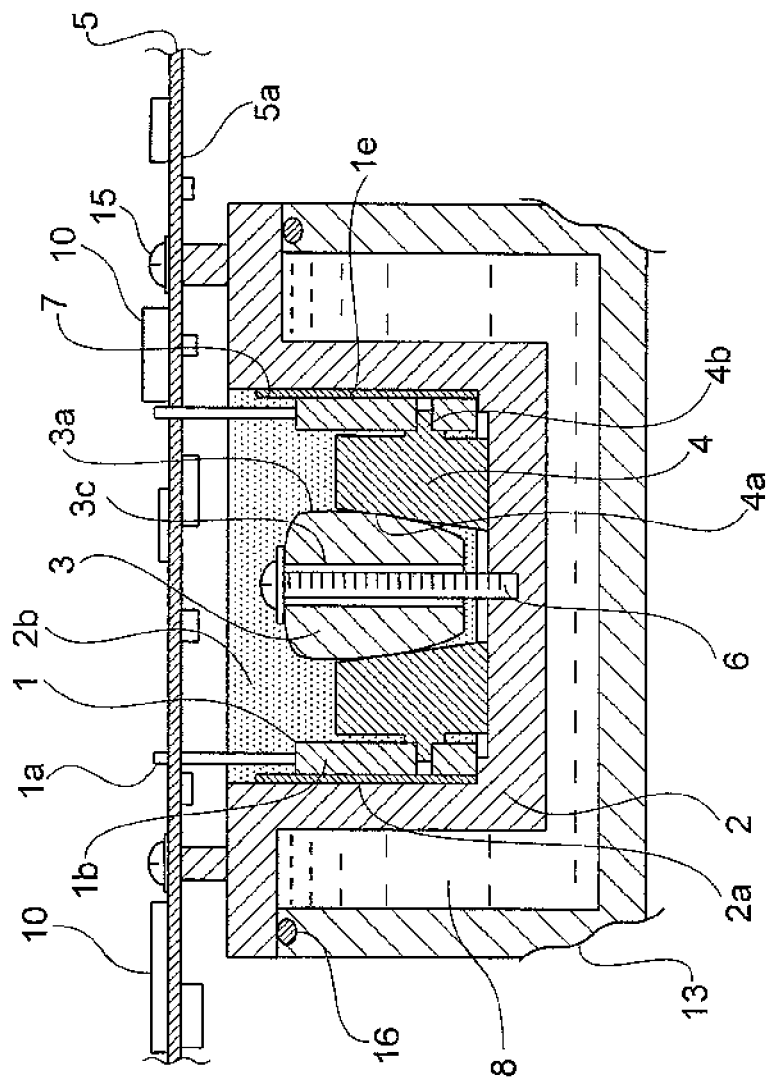
FIG. 4 is a sectional view illustrating a principal part of a semiconductor device according to a second embodiment of the present invention.

FIG. 4 is a sectional view illustrating a semiconductor device according to a second embodiment of the present invention.

In this embodiment, the inclined surfaces 3a of the first pressing member 3 have a curved shape projecting toward the second pressing members 4.

The remaining configuration is the same as that of the semiconductor device according to the first embodiment.

In this embodiment, the inclined surface 3a of the first pressing member 3 has the curved shape projecting toward the second pressing members 4. As a result, even when parallelism between the first pressing member 3 and the second pressing members 4 is varied, the variation is absorbed by the inclined surface 3a having the curved shape. As a result, the heating elements 1, the heat-radiating sheets 7, and the heat-radiating member 2 are reliably pressed so as to be brought into contact with each other without generating a gap therebetween.

As a result, a thermal resistance between each of the heating elements 1 and the heat-radiating member 2 is reduced to be small. In this manner, efficient heat-radiating performance can be stably obtained.

Even when the inclined surfaces 4a of the second pressing members 4 are formed to have a curved shape projecting toward the first pressing member 3, the same effects can be obtained.

Third Embodiment

Figure 5:
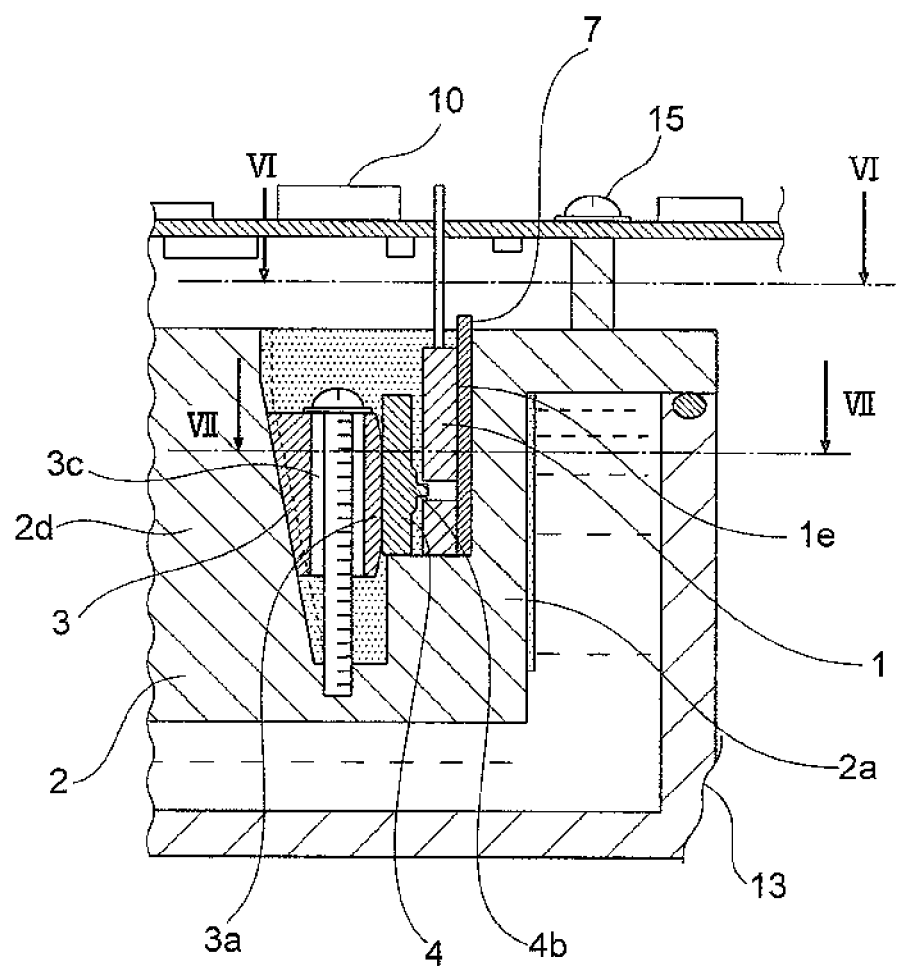
FIG. 5 a sectional view illustrating a principal part of a semiconductor device according to a third embodiment of the present invention.
Figure 6:
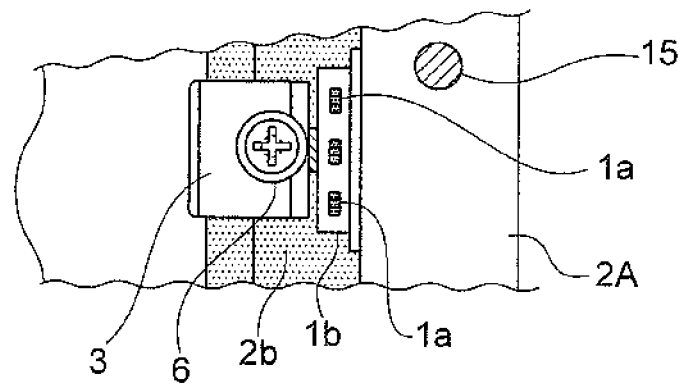
FIG. 6 is a sectional view taken along the line VI-VI in FIG. 5.
Figure 7:
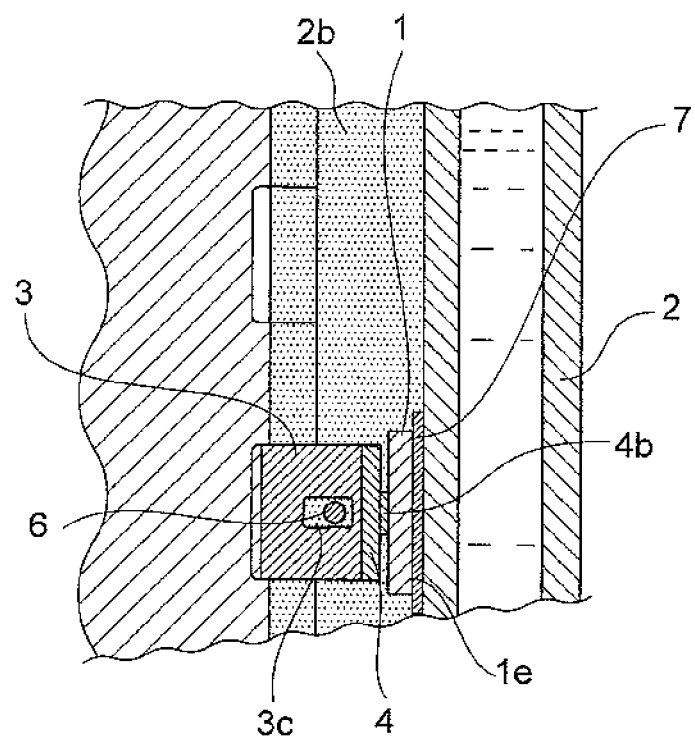
FIG. 7 is a sectional view taken along the line VII-VII in FIG. 5.

FIG. 5 is a sectional view illustrating a principal part of a semiconductor device according to a third embodiment of the present invention, FIG. 6 is a sectional view taken along the line VI-VI in FIG. 5, as viewed from a direction indicated by the arrows VI, and FIG. 7 is a sectional view taken along the line VII-VII in FIG. 5, as viewed from a direction indicated by the arrows VII.

In this embodiment, the heat-radiating member 2 includes a supporting portion 2d having a trapezoidal sectional shape which is provided in the center portion together with the element contact portions 2a.

The first pressing member 3 has a wedge-like sectional shape on the side opposite to the heating element 1 and has a curved sectional shape projecting toward the heating element 1 on the side of the heating element 1. The wedge-like shaped portion of the first pressing member 3 is held in surface contact with the supporting portion 2d of the heat-radiating member 2. The curved-surface portion of the first pressing member 3 is held in abutment against the second pressing member 4.

The through hole 3c of the first pressing member 3 is an elongated hole with an inner-diameter size in the vertical direction with respect to the element contact portion 2a, which is larger than an inner-diameter size in a direction perpendicular to the vertical direction. Although the elongated hole has a rectangular shape in FIG. 7, the elongated hole may have an oval shape.

This embodiment differs from the first and second embodiments in that the single heating element 1 is pressed against the heat-radiating member 2 by the first pressing member 3 although the two heating elements 1 are pressed against the heat-radiating member 2 by the first pressing member 3 in the first and second embodiments.

The remaining configuration is the same as that of the semiconductor device of the first embodiment.

In this embodiment, the first pressing member 3 moves toward the heating element 1 to press the heating element 1 against the heat-radiating member 2 in accordance with a tightening amount of the fixation screw 6 to the heat-radiating member 2. Therefore, the same effects as those of the semiconductor devices of the first and second embodiments can be obtained.

Moreover, the portion of the first pressing member 3, which is held in abutment against the second pressing member 4, has the curved surface. Therefore, as in the case of the second embodiment, even when the parallelism between the first pressing member 3 and the second pressing member 4 is varied, the variation is absorbed by the curved surface. As a result, the heating element 1, the heat-radiating sheet 7, and the heat-radiating member 2 are reliably pressed so as to be brought into contact with each other without generating a gap therebetween.

Fourth Embodiment

Figure 8:
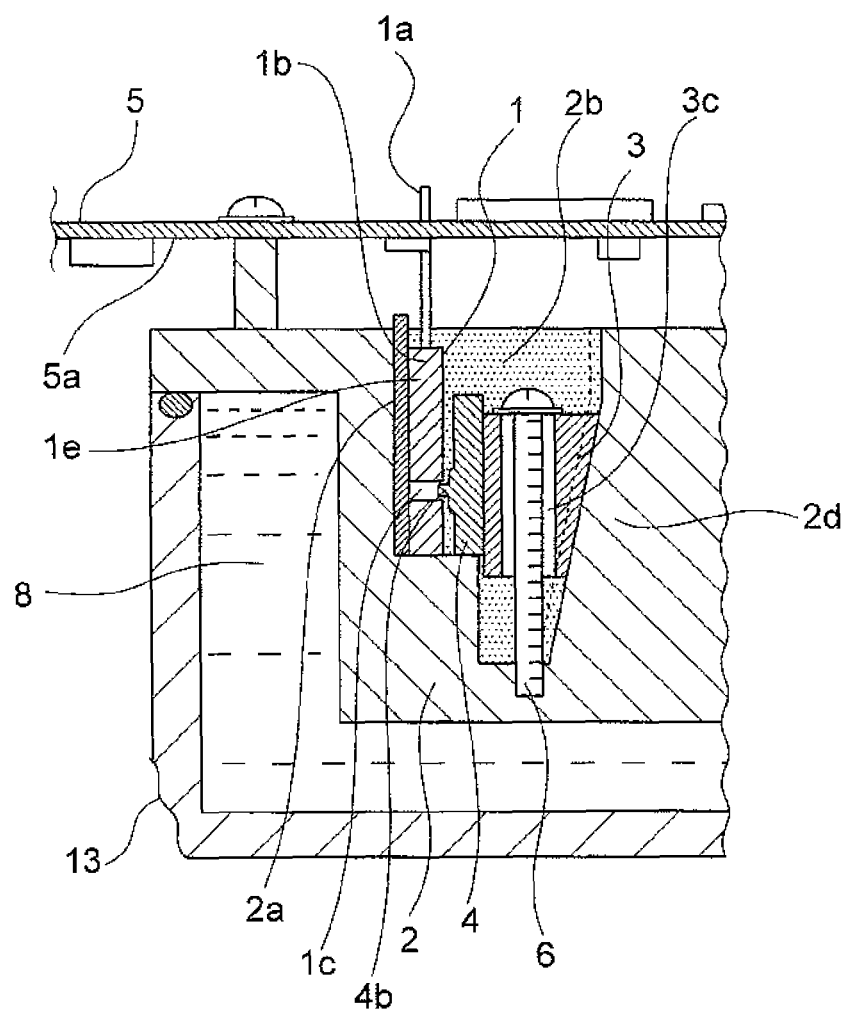
FIG. 8 a sectional view illustrating a principal part of a semiconductor device according to a fourth embodiment of the present invention.

FIG. 8 is a sectional view illustrating a principal part of a semiconductor device according to a fourth embodiment of the present invention.

In this embodiment, the first pressing member 3 has a wedge-like sectional shape on the side opposite to the heating element 1. The first pressing member 3 has a rectangular sectional shape on the side of the heating element 1. The wedge-like portion of the first pressing member 3 is held in surface contact with the supporting portion 2d of the heat-radiating member 2. The rectangular portion of the first pressing member 3 is held in surface contact with the second pressing member 4.

The projection 4b having a curved base portion is formed on the second pressing member 4 on the side of the heating element 1. A distal end portion of the projection 4b is loosely fitted into the mounting hole 1c of the heating element 1.

Further, as in the semiconductor device of the third embodiment, the through hole 3c of the first pressing member 3 is an elongated hole with an inner-diameter size in the vertical direction with respect to the element contact portion 2a, which is larger than an inner-diameter size in a direction perpendicular to the vertical direction.

This embodiment differs from the embodiments described above in that the single heating element 1 is pressed against the heat-radiating member 2 by the first pressing member 3.

The remaining configuration is the same as that of the semiconductor device of the first embodiment.

In this embodiment, the first pressing member 3 moves toward the heating element 1 to press the heating element 1 against the heat-radiating member 2 in accordance with a tightening amount of the fixation screw 6 to the heat-radiating member 2. Therefore, the same effects as those of the semiconductor devices of the first and second embodiments can be obtained.

Moreover, the projection 4b having a curved base portion of the second pressing member 4 is loosely fitted into the mounting hole 1c of the heating element 1. Therefore, as in the case of the second embodiment, even when the parallelism between the first pressing member 3 and the second pressing member 4 is varied, the variation is absorbed by the curved base portion of the projection 4b. As a result, the heating element 1, the heat-radiating sheet 7, and the heat-radiating member 2 are reliably pressed so as to be brought into contact with each other without generating a gap therebetween.

Fifth Embodiment

Figure 9:
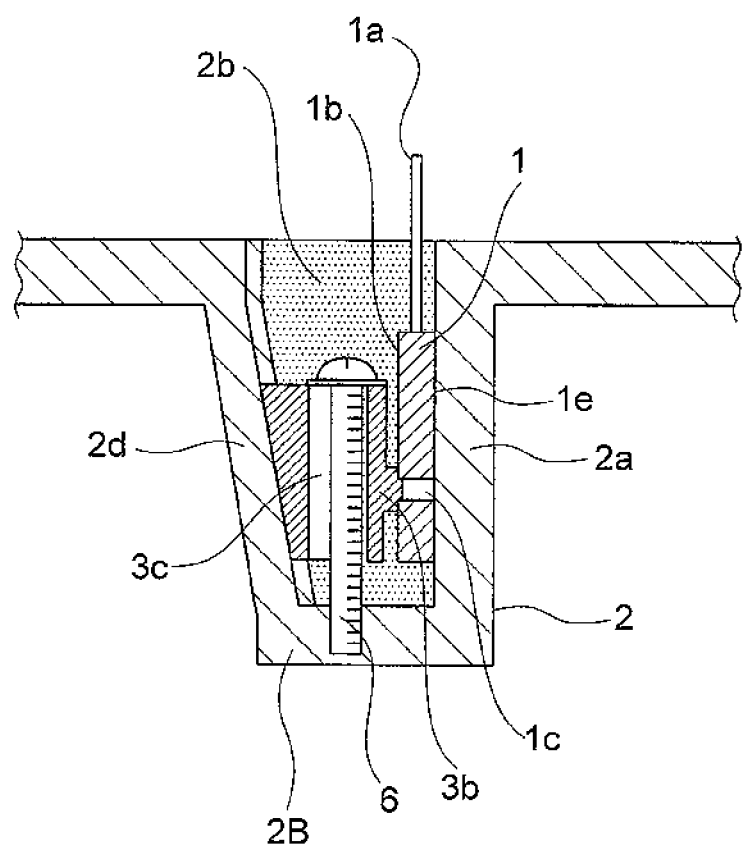
FIG. 9 a sectional view illustrating a principal part of a semiconductor device according to a fifth embodiment of the present invention.

FIG. 9 is a sectional view illustrating a principal part of a semiconductor device according to a fifth embodiment of the present invention.

In this embodiment, the first pressing member 3 has a wedge-like sectional shape on the side opposite to the heating element 1. The first pressing member 3 has a rectangular sectional shape on the side of the heating element 1. The wedge-like portion of the first pressing member 3 is held in surface contact with the supporting portion 2d of the heat-radiating member 2, which is opposed to the element contact portion 2a. A projection 3b fitted into the mounting hole 1c of the heating element 1 is formed in the rectangular portion of the first pressing member 3.

In this embodiment, the second pressing member 4, which is provided between the first pressing member 3 and the heating element 1, is eliminated.

The remaining configuration is the same as that of the fourth embodiment.

In this embodiment, the first pressing member 3 presses the heating element 1 against the heat-radiating member 2 while moving down the heating element 1 in accordance with the tightening amount of the fixation screw 6 to the heat-radiating member 2. As a result, the same effects as those of the semiconductor devices of the first and second embodiments can be obtained.

Moreover, the size can be further reduced by the amount corresponding to the elimination of the second pressing member 4.

Further, although the fastening screw is used as the fastening means in each of the embodiments described above, the fastening means is not limited thereto. For example, a rivet may be used instead.

Moreover, the heating element 1 and the heat-radiating member 2 may be held in direct surface contact with each other without providing the heat-radiating sheet 7 between the heating element 1 and the heat-radiating member 2.

REFERENCE SIGNS LIST 1 heating element, 1a terminal, 1b package, 1c mounting hole, 1d conductor portion, 1e mounting surface, 2 heat-radiating member, 2a element contact portion, 2b grease, 2c concave portion, 2d supporting portion, 3 first pressing member, 3a inclined surface, 3b projection, 3c through hole, 4 second pressing member, 4a inclined surface, 4b projection, 5 mounting board, 5a board mounting surface, 6 fixation screw (fastening means), 15 fixation screw, 7 heat-radiating sheet, 8 cooler, 10 electronic component, 11 coil (high-current component), 12 capacitor (high-current component), 13 case, 14 cover, 16 O-ring, 20 pressing means.

The invention claimed is:

1. A semiconductor device, comprising:
a heating element including terminals extending in a vertical direction with respect to a mounting board, the heating element being connected to the mounting board through the terminals;
a heat-radiating member including an element contact portion which is held in direct or indirect surface contact with a mounting surface of the heating element;
pressing means held in contact with the heating element, for pressing the heating element against the heat-radiating member; and
fastening means for fixing the pressing means to the heat-radiating member through a through hole formed through the pressing means in parallel to the mounting surface,
wherein the pressing means includes an inclined surface formed so that a component force of an axial force of a tightening force of the fastening means is generated in a vertical direction with respect to the mounting surface,
wherein h heating element includes a resin-molded package, and the pressing means is held in direct contact with the resin-molded package of the heating element.

2. A semiconductor device according to claim 1, wherein:
the pressing means comprises a first pressing member having the through hole and a second pressing member having one surface held in contact with the first pressing member and another surface held in contact with the heating element; and
the first pressing member and the second pressing member are held in contact with each other at the inclined surfaces provided to the first pressing member and the second pressing member, respectively.

3. A semiconductor device according to claim 2, wherein one of the inclined surface of the first pressing member and the inclined surface of the second pressing member has a curved shape projecting toward another one of the inclined surface of the first pressing member and the inclined surface of the second pressing member.

4. A semiconductor device according to claim 1, wherein:
the heat-radiating member comprises a supporting portion opposed to the element contact portion; and
the pressing means comprises a first pressing member including the through hole and the inclined surface which is held in surface contact with the supporting portion.

5. A semiconductor device according to claim 4, wherein the pressing means further comprises a second pressing member having one surface held in contact with the first pressing member and another surface held in contact with the heating element.

6. A semiconductor device according to claim 5, wherein one of the first pressing member and the second pressing member has a curved surface projecting toward a contact side.

7. A semiconductor device according to claim 1, wherein the pressing means includes a projection that is brought into direct contact with the heating element to press the heating element.

8. A semiconductor device according to claim 7, wherein the heating element includes a mounting hole formed in the resin-molded package of the heating element, into which the projection is to be inserted.

9. A semiconductor device according to claim 1, wherein the through hole is an elongated hole having an inner-diameter size in the vertical direction with respect to the mounting surface, which is larger than an inner-diameter size in a direction perpendicular to the vertical direction.

10. A semiconductor device according to claim 1, wherein a heat-radiating sheet is provided between the heating element and the element contact portion of the heat-radiating member.

11. A semiconductor device according to claim 1, wherein the fastening means comprises a fixation screw.

12. An in-vehicle power converter, comprising:
a semiconductor device according to claim 1; and
a cooler for cooling a large-current component, the cooler including a cooling medium hermetically sealed therein,
wherein the semiconductor device is embedded in the cooler including the element contact portion of the heat-radiating member.

* * * * *